US012794192B2

(12) United States Patent
Kaide et al.

(10) Patent No.: US 12,794,192 B2
(45) Date of Patent: Nov. 10, 2026

(54) LIGHT-EMITTING DEVICE AND LIGHT-EMITTING MODULE

(71) Applicant: NICHIA CORPORATION, Anan (JP)

(72) Inventors: Yusuke Kaide, Tokushima (JP); Shota Takase, Tokushima (JP); Masanori Uemura, Anan (JP)

(73) Assignee: NICHIA CORPORATION, Anan (JP)

( * ) Notice: Subject to any disclaimer, the term of this patent is extended or adjusted under 35 U.S.C. 154(b) by 754 days.

(21) Appl. No.: 18/308,618

(22) Filed: Apr. 27, 2023

(65) Prior Publication Data

US 2023/0352902 A1 Nov. 2, 2023

(30) Foreign Application Priority Data

Apr. 30, 2022 (JP) ................................ 2022-075624
May 16, 2022 (JP) ................................ 2022-079881

(51) Int. Cl.
*H01S 5/023* (2021.01)
*H01S 5/068* (2006.01)
*H01S 5/40* (2006.01)

(52) U.S. Cl.
CPC .......... *H01S 5/023* (2021.01); *H01S 5/06825* (2013.01); *H01S 5/4025* (2013.01)

(58) Field of Classification Search
CPC .... H01S 5/023; H01S 5/06825; H01S 5/4025; H01S 5/4031; H01S 5/02253;
(Continued)

(56) References Cited

U.S. PATENT DOCUMENTS

2006/0251138 A1 11/2006 Hata et al.
2013/0240942 A1* 9/2013 Inoue .................. H10H 20/817 257/98
(Continued)

FOREIGN PATENT DOCUMENTS

CN 111313224 A 6/2020
JP 2001-135748 A 5/2001
(Continued)

OTHER PUBLICATIONS

Arik, Mehmet & Becker, Charles & Weaver, Stanton & Petroski, James. (2004). Thermal Management of LEDs: Package to System. Proceedings of SPIE—The International Society for Optical Engineering. 5187. 10.1117/12.512731. (Year: 2004).*

*Primary Examiner* — Tod T Van Roy
*Assistant Examiner* — Jasmin Kaur Mundi
(74) *Attorney, Agent, or Firm* — Spencer Fane LLP

(57) ABSTRACT

A light-emitting device includes a submount, a semiconductor laser element, and a protective element. The submount includes a wiring pattern. The wiring pattern includes first and second regions connected at a first position. The semiconductor laser element is disposed on the first region. The protective element is disposed on the second region. The width of the first region is greater than a width of the semiconductor laser element in the first direction. The length of the first region in a second direction between the first position and a distal end of the first region is a second distance. A maximum width of the second region is greater than the width of the first region in the first direction at the first position. An interval in the second direction between the semiconductor laser element and the protective element is greater than 0 μm and less than 170 μm.

12 Claims, 11 Drawing Sheets

(58) Field of Classification Search
CPC ............. H01S 5/02255; H01S 5/02208; H01S 5/02345; H01S 5/0239; H01S 5/026; H01S 5/0261
See application file for complete search history.

(56) References Cited

U.S. PATENT DOCUMENTS

| | | | | |
|---|---|---|---|---|
| 2020/0194974 | A1* | 6/2020 | Kozuru | G03B 21/2033 |
| 2020/0227888 | A1* | 7/2020 | Nakagaki | H01S 5/02255 |
| 2020/0235548 | A1* | 7/2020 | Miura | H01S 5/0425 |
| 2020/0251881 | A1 | 8/2020 | Nakagaki et al. | |
| 2021/0359488 | A1 | 11/2021 | Kagaya | |
| 2022/0102332 | A1 | 3/2022 | Imai et al. | |
| 2022/0149592 | A1 | 5/2022 | Itabashi | |
| 2023/0071897 | A1 | 3/2023 | Kozuru et al. | |
| 2023/0108294 | A1* | 4/2023 | Enomoto | H01S 5/0233 257/79 |
| 2024/0222940 | A1 | 7/2024 | Kozuru et al. | |

FOREIGN PATENT DOCUMENTS

| | | | |
|---|---|---|---|
| JP | 2006-269987 | A | 10/2006 |
| JP | 2020-095939 | A | 6/2020 |
| JP | 2020-126992 | A | 8/2020 |
| JP | 2021-180293 | A | 11/2021 |
| JP | 2022-076389 | A | 5/2022 |

* cited by examiner

LIGHT-EMITTING DEVICE AND LIGHT-EMITTING MODULE

CROSS-REFERENCE TO RELATED APPLICATION

This application claims priority to Japanese Patent Application No. 2022-75624, filed on Apr. 30, 2022, and Japanese Patent Application No. 2022-79881 filed on May 16, 2022, the disclosures of which are hereby incorporated herein by reference in their entirety.

BACKGROUND OF THE INVENTION

The present invention relates to a light-emitting device or a light-emitting module.

In a light-emitting device disclosed in Japanese Unexamined Patent Application Publication No. 2020-126992, a wiring pattern on a submount is devised. Further, the above-mentioned publication discloses one form effective for a size reduction in a form in which a plurality of light-emitting elements are disposed on one submount.

When a plurality of components are mounted in a specific region, as the plurality of components can be disposed closer to each other, the number of the components that can be disposed inside the region may increase. Even in a case in which the same number of components is disposed, when certain components can be disposed closer to each other, a sufficient interval from the other component is generated, which may contribute to an improvement in stability or an increase in a degree of freedom of mounting. When a shape in a specific region, for example, which direction a width is sufficient and which direction a width is not sufficient are considered, a higher degree of priority may be provided to a preferable direction in which a mounting interval of the plurality of components is improved.

SUMMARY OF THE INVENTION

The present invention has an object to reduce, in a desired direction, a mounting region required for disposing a plurality of components.

One embodiment discloses a light-emitting device including a submount, a semiconductor laser element, and a protective element. The submount has a mounting surface. The submount includes a wiring pattern arranged on the mounting surface. The wiring pattern includes a first region and a second region connected to the first region at a first position on the mounting surface. The semiconductor laser element is disposed on the first region of the wiring pattern. The protective element is disposed on the second region of the wiring pattern. The width of the first region of the wiring pattern in a first direction is greater than a width of the semiconductor laser element in the first direction and equal to or less than a first distance. The length of the first region of the wiring pattern in a second direction between the first position and a distal end of the first region is a second distance. The second direction is perpendicular to the first direction. The second region is arranged on an opposite side of the first position with respect to the first region in a top view. A maximum width of the second region in the first direction is greater than the width of the first region in the first direction at the first position. An interval in the second direction between the semiconductor laser element and the protective element is greater than 0 μm and less than 170 μm.

According to certain embodiments of the disclosure, a mounting region required for disposing a plurality of components can be reduced in a desired direction.

BRIEF DESCRIPTION OF DRAWINGS

FIG. 7 is a cross-sectional view taken along a cross-sectional line VII-VII in

FIG. 6.

DETAILED DESCRIPTION

Figure 1:
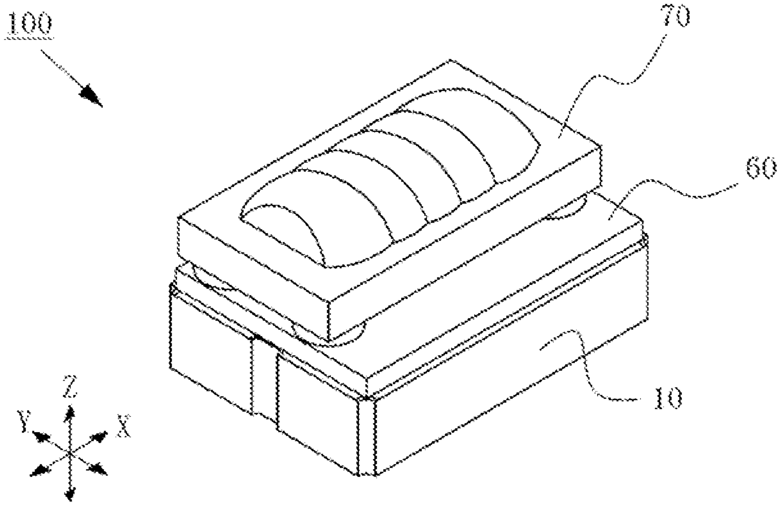
FIG. 1 is a perspective view of a light-emitting device according to a first embodiment.

In this description or the scope of the claims, polygons such as triangles and quadrangles, including shapes in which the corners of the polygon are rounded, chamfered, beveled, coved, or the like, are referred to as polygons. Furthermore, a shape obtained by processing not only the corners (ends of sides), but also an intermediate portion of a side is similarly referred to as a polygon. That is, a shape that is partially processed while remaining a polygon shape as a base is included in the interpretation of "polygon" described in this description and the scope of the claims.

The same applies not only to polygons but also to words representing specific shapes such as trapezoids, circles, protrusions, and recessions. Furthermore, the same applies when dealing with each side forming that shape. That is, even if processing is performed on a corner or an intermediate portion of a certain side, the interpretation of "side" includes the processed portion. Note that when a "polygon"

or "side" not partially processed is to be distinguished from a processed shape, "strict" will be added to the description as in, for example, "strict quadrangle".

Further, in the description and the claims, descriptions such as upper and lower (upward/downward), left and right, top and bottom, front and back (forward/backward), and near and far are used merely to describe the relative relationship of positions, orientations, directions, and the like, and the expressions need not necessarily match an actual relationship at the time of use.

In the drawings, directions such as an X direction, a Y direction, and a Z direction may be indicated by using arrows. The directions of the arrows are the same across multiple drawings of the same embodiment. In the drawings, a direction of the arrow in which X, Y, and Z are indicated is referred to as a positive direction, and a direction opposite to the positive direction is referred to as a negative direction. For example, the direction in which X is pointed by the arrow is the X direction and the positive direction. Note that a direction being the X direction and the positive direction is referred to as a "positive direction of X," and a direction opposite to the positive direction of X is referred to as a "negative direction of X." The same applies to the Y direction and the Z direction.

Further, "member" and "portion" may be described when, for example, a component and the like are described in this description. The term "member" refers to an object physically treated alone. The object physically treated alone can be an object treated as one part in a manufacturing step. On the other hand, the term "portion" refers to an object that may not be physically treated alone. For example, the term "portion" is used when a part of one member is partially regarded.

Note that the distinction between "member" and "portion" described above does not indicate an intention to consciously limit the scope of rights in interpretation of the doctrine of equivalents. In other words, even when there is a component described as "member" in the claims, this does not mean that the applicant recognizes that physically treating the component alone is essential in the application of the present invention.

Furthermore, in the description and the claims, when there are a plurality of components and each of these components is to be indicated separately, the components may be distinguished by adding the terms "first" and "second" at the beginning of the name of the component. Further, objects to be distinguished may differ between the description and the claims. Thus, even when a component in the claims is given the same term as that in the description, the object indicated by that component may not be the same across the description and the claims.

For example, when there are components distinguished by being termed "first", "second", and "third" in the description, and when components given the terms "first" and "third" in the description are described in the claims, these components may be distinguished by being denoted as "first" and "second" in the claims for ease of understanding. In this case, the components denoted as "first" and "second" in the claims refer to the components termed "first" and "third" in the description, respectively. Note that this rule is not limited to components and also applies to other objects in a reasonable and flexible manner.

Embodiments for implementing the present invention will be described below. Furthermore, specific embodiments for implementing the present invention will be described below with reference to the drawings. Note that embodiments for implementing the present invention are not limited to the specific embodiments. In other words, the illustrated embodiments are not the only form in which the present invention is realized. Note that sizes, positional relationships, and the like of members illustrated in the drawings may sometimes be exaggerated in order to facilitate understanding.

First Embodiment

Figure 2:
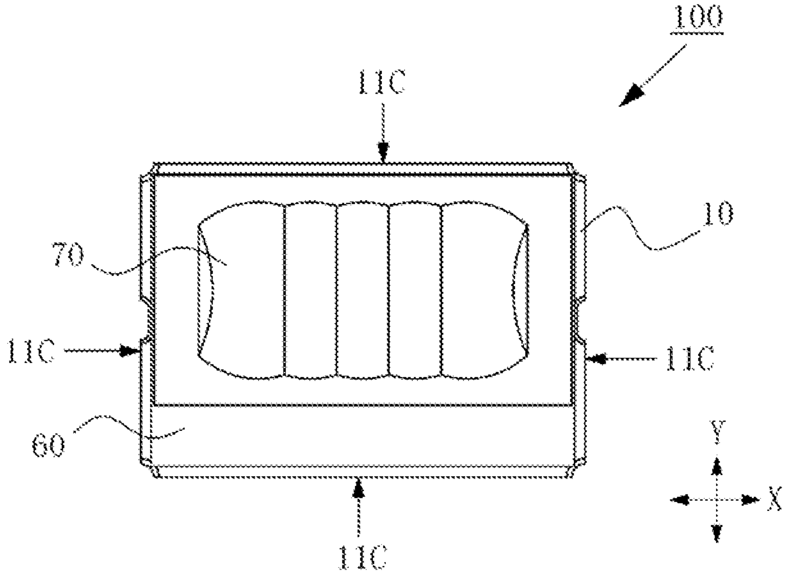
FIG. 2 is a top view of the light-emitting device according to the first embodiment.
Figure 3:
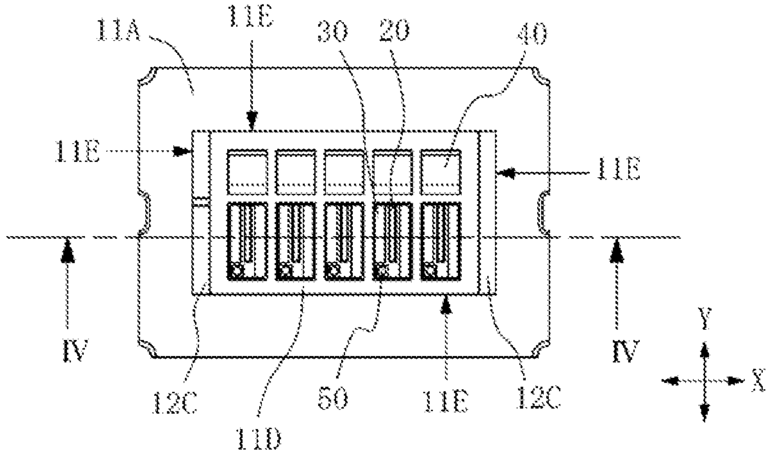
FIG. 3 is a top view illustrating each component disposed inside the light-emitting device according to the first embodiment.
Figure 4:
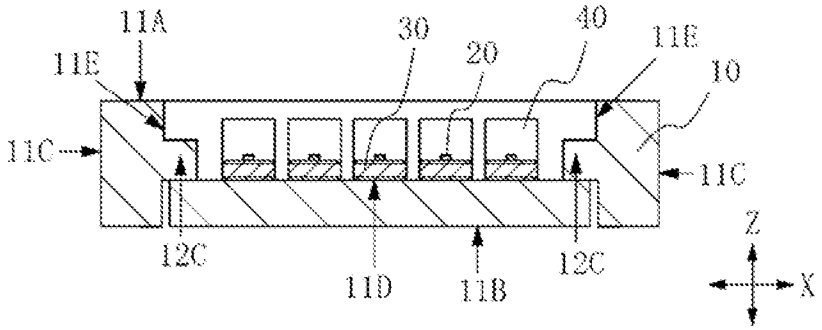
FIG. 4 is a cross-sectional view taken along a cross-sectional line IV-IV in FIG. 3.
Figure 5:
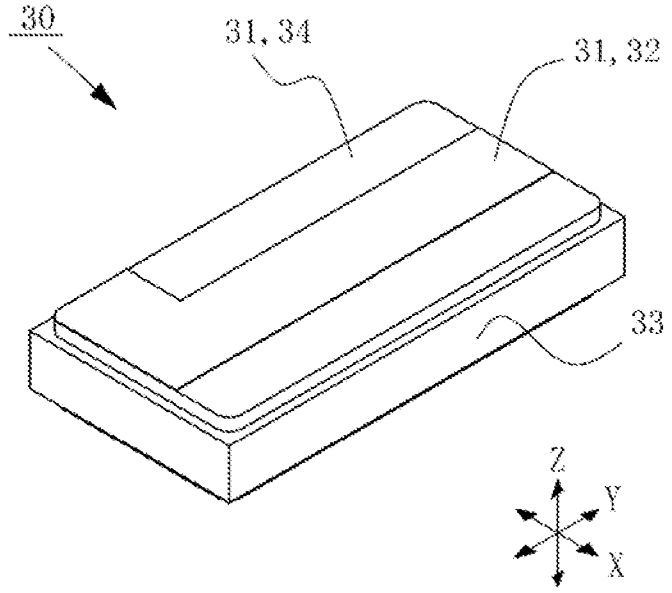
FIG. 5 is a perspective view of a submount according to each embodiment.
Figure 6:
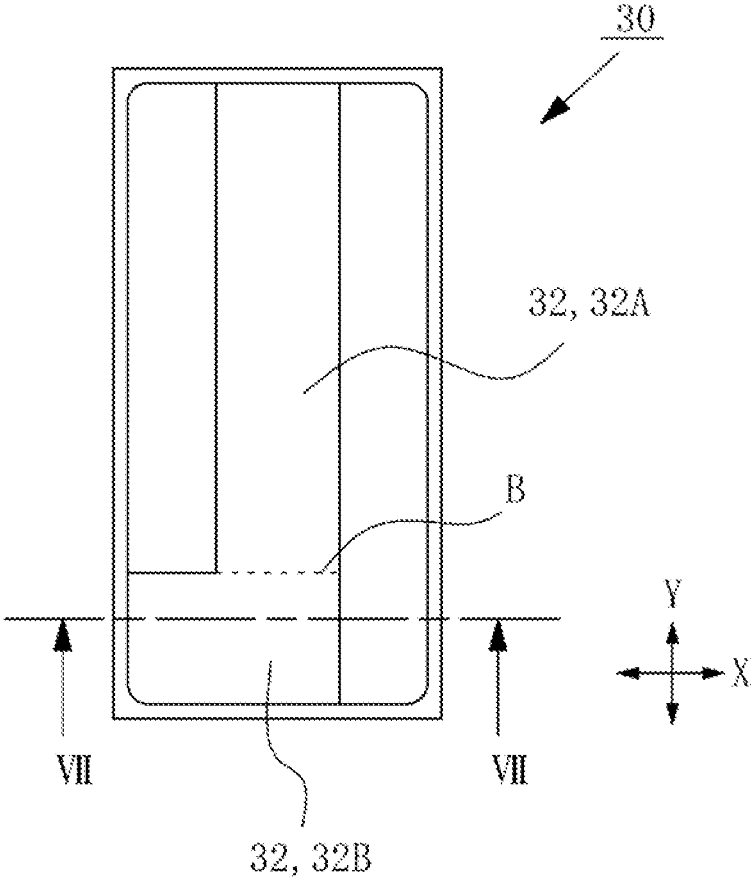
FIG. 6 is a top view of the submount according to each embodiment.
Figure 7:
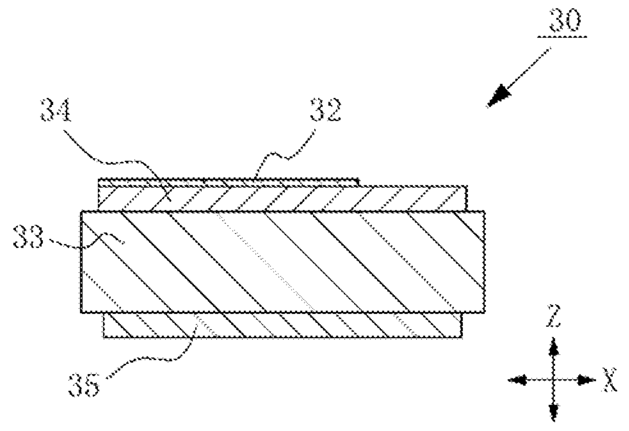
Figure 8:
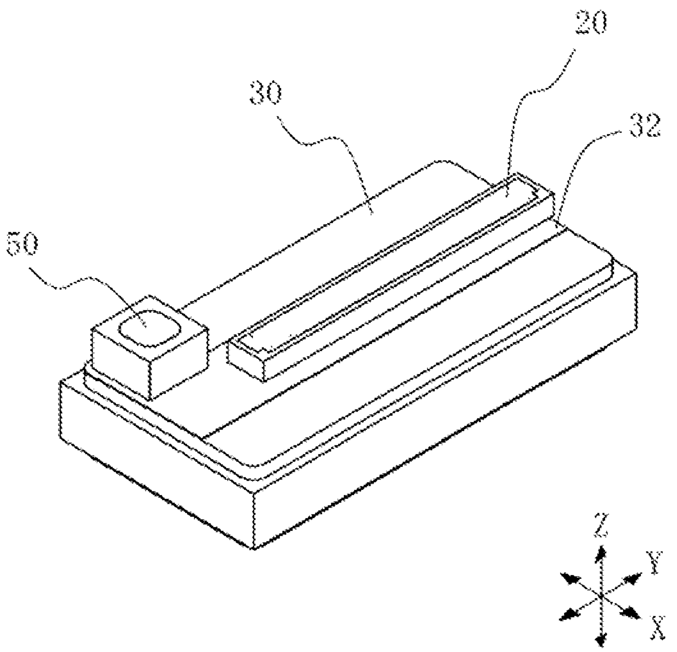
FIG. 8 is a perspective view in a state where a semiconductor laser element and the like are disposed on the submount.
Figure 9:
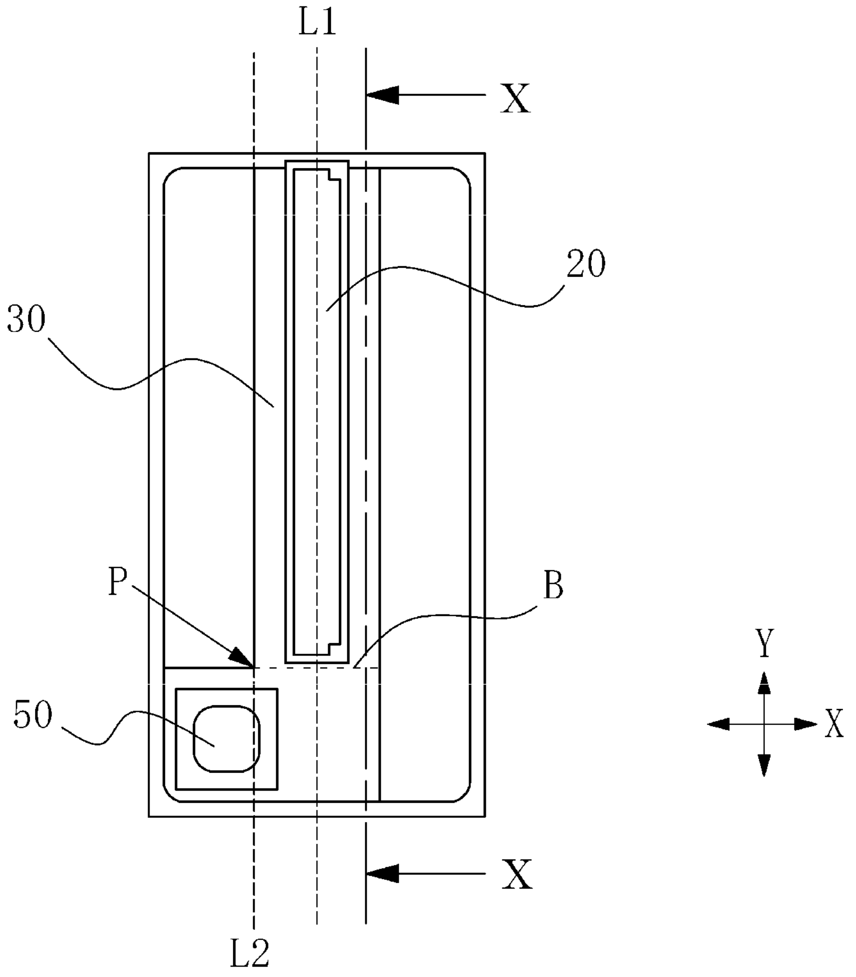
FIG. 9 is a top view in the state where the semiconductor laser element and the like are disposed on the submount.
Figure 10:
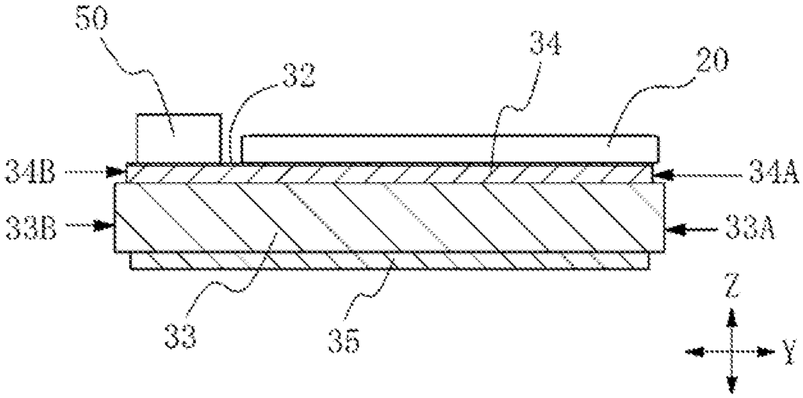
FIG. 10 is a cross-sectional view taken along a cross-sectional line X-X in FIG. 9.
Figure 11:
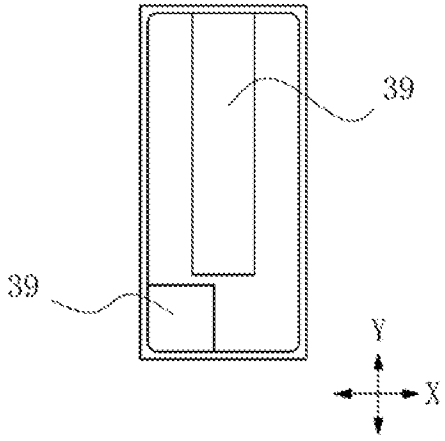
FIG. 11 is a top view of a submount given as an example of a comparison target.
Figure 12:
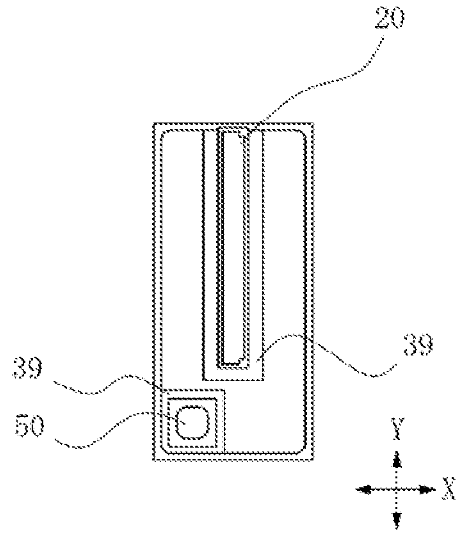
FIG. 12 is a top view in a state where the semiconductor laser element and the like are disposed on the submount given as the example of the comparison target.
Figure 13:
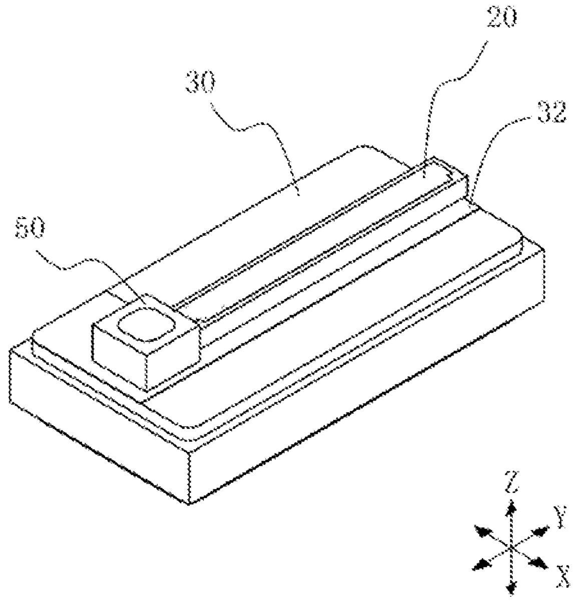
FIG. 13 is a perspective view illustrating another example in a state where the semiconductor laser element and the like are disposed on the submount.
Figure 14:
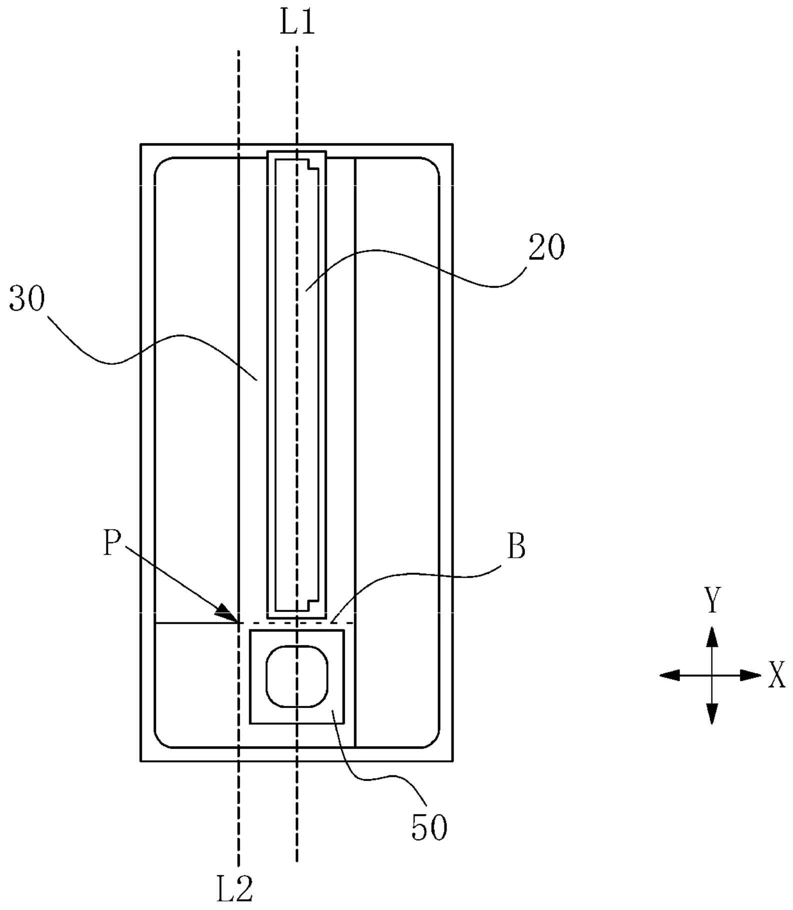
FIG. 14 is a top view illustrating the other example in the state where the semiconductor laser element and the like are disposed on the submount.

FIGS. 1 to 14 are drawings illustrating an exemplary form of a light-emitting device 100 according to a first embodiment. FIG. 1 is a perspective view of the light-emitting device 100. FIG. 2 is a top view of the light-emitting device 100. FIG. 3 is a top view illustrating each component disposed inside the light-emitting device 100. FIG. 4 is a cross-sectional view taken along a cross-sectional line IV-IV in FIG. 3. FIG. 5 is a perspective view of a submount 30. FIG. 6 is a top view of the submount 30. FIG. 7 is a cross-sectional view taken along a cross-sectional line VII-VII in FIG. 6. FIG. 8 is a perspective view illustrating a state where a semiconductor laser element 20 and a protective element 50 are disposed on the submount 30. FIG. 9 is a top view in the same state as that in FIG. 8. FIG. 10 is a cross-sectional view taken along a cross-sectional line X-X in FIG. 9. FIG. 11 is a top view of a submount given as an example of a comparison target. FIG. 12 is a top view in a state where the semiconductor laser element 20 and the protective element 50 are disposed on the submount given as the example of the comparison target. Note that FIGS. 11 and 12 are merely an example for assistance in understanding the invention, and do not give a so-called comparative example as a related art. FIG. 13 is a perspective view illustrating another example in a state where the semiconductor laser element 20 and the protective element 50 are disposed on the submount 30. FIG. 14 is a top view in the same state as that in FIG. 13.

The light-emitting device 100 includes a plurality of components. The plurality of components included in the light-emitting device 100 include a base 10, one or a plurality of the semiconductor laser elements 20, one or a plurality of the submounts 30, one or a plurality of reflective members 40, one or a plurality of the protective elements 50, a lid member 60, and a lens member 70.

Note that the light-emitting device 100 may include a component other than the components described above. For example, the light-emitting device 100 may further include a light-emitting element different from the one or the plurality of semiconductor laser elements 20. Further, the light-emitting device 100 may not include some of the components described above.

First, each of the components of the light-emitting device 100 will be described, and, subsequently, the light-emitting device 100 will be described.

Base 10

The base 10 includes an upper surface 11A, a lower surface 11B, and one or a plurality of outer lateral surfaces 11C. In a top view, an outer edge shape of the base 10 is rectangular. This rectangular shape may be a shape with long sides and short sides. In the illustrated base 10, a long side direction of the rectangle is the same direction as the X direction, and a short side direction is the same direction as the Y direction. Note that the outer edge shape of the base 10 in the top view may not be a rectangular shape.

A recessed shape is formed in the base 10. A recessed shape being recessed downward from the upper surface 11A is formed from the upper surface 11A. A recess is defined by the recessed shape of the base 10. The recess is surrounded by the upper surface 11A in the top view.

An inner edge of the upper surface 11A defines an outer edge of the recess. In other words, an inner edge shape of the upper surface 11A and an outer edge shape of the recess match each other. In the top view, an outer edge shape of the recess is rectangular. This rectangular shape may be a shape with long sides and short sides. In the illustrated base 10, a long side direction of the rectangle is the same direction as the X direction, and a short side direction is the same direction as the Y direction. Note that the outer edge shape of the recess may not be rectangular.

The base 10 includes a mounting surface 11D. Further, the base 10 includes one or a plurality of inner lateral surfaces 11E. The mounting surface 11D is located below the upper surface 11A and above the lower surface 11B. The mounting surface 11D is an upper surface. Therefore, it can be said that the mounting surface 11D is an upper surface different from the upper surface 11A. The mounting surface 11D is a flat surface having a shape with a width in the X direction greater than a length in the Y direction.

The one or the plurality of inner lateral surfaces 11E are located above the mounting surface 11D. The one or the plurality of inner lateral surfaces 11E intersect the upper surface 11A. The mounting surface 11D and the one or the plurality of inner lateral surfaces 11E are included in a plurality of surfaces that define the recess of the base 10. The one or the plurality of inner lateral surfaces 11E define the outer edge shape of the recess.

The one or the plurality of inner lateral surfaces 11E are provided perpendicular to the mounting surface 11D. The description of "perpendicular" here allows a difference within ±3 degrees. Note that the inner lateral surface 11E may not be perpendicular to the mounting surface 11D.

The base 10 includes one or a plurality of stepped portions 12C. The stepped portion 12C includes an upper surface and an inner lateral surface that intersects the upper surface and extends downward from the upper surface. The surface included in the stepped portion 12C does not include an inner lateral surface extending upward from the upper surface. The upper surface of the stepped portion 12C intersects the inner lateral surface 11E. The inner lateral surface 11E extends upward from the upper surface of the stepped portion 12C. The inner lateral surface of the stepped portion 12C intersects the mounting surface 11D.

The stepped portion 12C is formed along a part or the whole of the inner lateral surface 11E in the top view. The one or the plurality of stepped portions 12C are formed inside the upper surface 11A in the top view. The one or the plurality of stepped portions 12C are formed inside the one or the plurality of inner lateral surfaces 11E in the top view.

The base 10 may include the plurality of stepped portions 12C. Each of the plurality of stepped portions 12C is formed along the inner lateral surface 11E in the top view. The plurality of stepped portions 12C include the stepped portion 12C formed along the inner lateral surface 11E across an entire length of the inner lateral surface 11E in the top view.

One or a plurality of wiring patterns are provided on the upper surface of the stepped portion 12C. The wiring pattern is electrically connected to the other wiring pattern via a wiring line passing through the interior of the base 10. The other wiring pattern is provided on the lower surface of the base 10, for example. Note that the wiring pattern may be electrically connected to a wiring pattern provided on the upper surface 11A or the outer lateral surface 11C.

The plurality of wiring patterns may be provided on the upper surface of the one or the plurality of stepped portions 12C. In each of the plurality of stepped portions 12C, the one or the plurality of wiring patterns may be provided. Note that, in the base 10, a place where the wiring pattern is provided may not be limited to the stepped portion 12C.

The base 10 can be formed using ceramic as a main material. Further, the base 10 may be formed by bonding a bottom member that is formed by using metal or a composite containing metal as a main material and includes the mounting surface 11D, and a frame member that is formed by using ceramic as a main material and includes the wiring pattern.

Here, the main material refers to a material that occupies the greatest ratio of a target formed product in terms of weight or volume. Note that, when a target formed product is formed of one material, that material is the main material. In other words, when a certain material is the main material, the percentage of that material may be 100%.

Examples of the ceramic include aluminum nitride, silicon nitride, aluminum oxide, and silicon carbide. Examples of the metal include copper, aluminum, and iron. Alternatively, as the composite containing metal, copper molybdenum, a copper-diamond composite material, copper tungsten, and the like can be used.

Semiconductor Laser Element 20

The semiconductor laser element 20 includes a light emission surface that emits light. The semiconductor laser element 20 includes an upper surface, a lower surface, and a plurality of lateral surfaces. The upper surface or the lateral surface of the semiconductor laser element 20 is the light emission surface. The semiconductor laser element 20 includes one or a plurality of the light emission surfaces.

A shape of the upper surface of the semiconductor laser element 20 is a rectangular shape having long sides and short sides. A lateral surface having a short side of the rectangle may be the light emission surface. Note that the shape of the upper surface of the semiconductor laser element 20 need not be rectangular.

A single emitter-semiconductor laser element can be employed for the semiconductor laser element 20. Further, a multi-emitter semiconductor laser element including a plurality of emitters can be employed for the semiconductor laser element 20.

As the semiconductor laser element 20, for example, a light-emitting element that emits blue light, a light-emitting element that emits green light, or a light-emitting element that emits red light can be employed. Note that a light-emitting element that emits light of another color or light having another wavelength may be employed as the semiconductor laser element 20.

Blue light refers to light having an emission peak wavelength within a range from 420 nm to 494 nm. Green light refers to light having an emission peak wavelength within a range from 495 nm to 570 nm. Red light refers to light having an emission peak wavelength within a range from 605 nm to 750 nm.

The semiconductor laser element 20 emits laser light having directivity. Divergent light that spreads is emitted from a light emission surface (emission end surface) of the semiconductor laser element 20. The light emitted from the semiconductor laser element 20 forms a far field pattern (hereinafter, referred to as an "FFP") of an elliptical shape in a plane parallel to the light emission surface of the light.

The FFP indicates a shape and a light intensity distribution of the emitted light at a position separated from the light emission surface.

Here, light passing through the center of the elliptical shape of the FFP, in other words, light having a peak intensity in the light intensity distribution of the FFP is referred to as light traveling on an optical axis or light passing through an optical axis. Based on the light intensity distribution of the FFP, light having an intensity of $1/e^2$ or more with respect to a peak intensity value is referred to as a main portion of the light.

The shape of the FFP of the light emitted from the semiconductor laser element 20 is an elliptical shape in which the light in a layering direction is longer than that in a direction perpendicular to the layering direction in the plane parallel to the light emission surface of the light. The layering direction is a direction in which a plurality of semiconductor layers including an active layer are layered in the semiconductor laser element 20. The direction perpendicular to the layering direction can also be referred to as a plane direction of the semiconductor layer. Further, a long diameter direction of the elliptical shape of the FFP can also be referred to as a fast axis direction of the semiconductor laser element 20, and a short diameter direction of the elliptical shape of the FFP can also be referred to as a slow axis direction of the semiconductor laser element 20.

Based on the light intensity distribution of the FFP, an angle at which light having a light intensity of $1/e^2$ of a peak light intensity spreads is referred to as a divergence angle of light of the semiconductor laser element 20. For example, a divergence angle of light may also be determined based on the light intensity that is half of the peak light intensity in addition to being determined based on the light intensity of $1/e^2$ of the peak light intensity. In the description herein, the term “divergence angle of light” by itself refers to a spread angle of light at the light intensity of $1/e^2$ of the peak light intensity. Note that it can be said that a divergence angle in the fast axis direction is greater than a divergence angle in the slow axis direction.

Examples of the semiconductor laser element 20 that emits blue light or the semiconductor laser element 20 that emits green light include a semiconductor laser element including a nitride semiconductor. A GaN-based semiconductor such as GaN, InGaN, and AlGaN, for example, can be used as the nitride semiconductor. Examples of the semiconductor laser element 20 that emits red light include a semiconductor laser element including an InAlGaP-based semiconductor, a GaInP-based semiconductor, or a GaAs-based semiconductor such as GaAs and AlGaAs.

Submount 30

The submount 30 has an upper surface, a lower surface, and one or a plurality of lateral surfaces. It can be said that the upper surface of the submount 30 is a mounting surface 31 on which the other components are mounted. The submount 30 includes the mounting surface 31, and a wiring pattern 32 arranged on the mounting surface 31 of the submount 30.

The submount 30 has an outer shape having a length in one direction (hereinafter, the direction is referred to as a short-side direction) smaller than a length in a direction (hereinafter, the direction is referred to as a long-side direction) perpendicular to the one direction in the top view. In the top view, the outer shape of the submount 30 is rectangular. The upper surface of the submount 30 may have a rectangular shape with short sides and long sides. Note that the upper surface may have a square shape. In the illustrated submount 30, the short-side direction is the same direction as the X direction, and the long-side direction is the same direction as the Y direction.

The submount 30 may include a substrate 33 and a first metal layer 34. The submount 30 may further include a second metal layer 35. The first metal layer 34 is provided on an upper surface side of the substrate 33. The second metal layer 35 is provided on a lower surface side of the substrate 33.

A shape of the substrate 33 is, for example, a rectangular parallelepiped having a length in the long-side direction greater than a width in the short-side direction. Note that the shape may not be the rectangular parallelepiped shape. A shape of the first metal layer 34 may be a rectangle that is smaller than the substrate 33 and has short sides and long sides in the top view. A shape of the second metal layer 35 may be a rectangle that is smaller than the substrate 33 and has short sides and long sides in the top view.

The substrate 33 has insulation properties. The substrate 33 is formed of, for example, silicon nitride, aluminum nitride, or silicon carbide. As a main material of the substrate 33, ceramic having relatively high heat dissipation may be selected.

The first metal layer 34 may be directly provided on the substrate 33, or may be indirectly provided with the other component interposed therebetween. In the illustrated submount 30, the first metal layer 34 is directly provided on the substrate 33. The same applies to the second metal layer 35.

A metal such as copper and aluminum is used as a main material of the first metal layer 34 and the second metal layer 35. The first metal layer 34 has a height (thickness) in an up-down direction in a range from 30 μm to 200 μm. The first metal layer 34 is a thickest metal layer among one or a plurality of metal layers provided above the substrate 33. The second metal layer 35 is a thickest metal layer among one or a plurality of metal layers provided below the substrate 33.

The wiring pattern 32 is provided on the first metal layer 34. An upper surface of the wiring pattern 32 and an upper surface of the first metal layer 34 may be the mounting surface 31 of the submount 30. A height (thicknesses) of the wiring pattern 32 in the up-down direction is in a range from 300 nm to 3000 nm. The height (thicknesses) of the wiring pattern 32 in the up-down direction may be in a range from 300 nm to 1500 nm. The thickness of the wiring pattern 32 may be equal to or less than one-tenth of the thickness of the first metal layer 34.

The wiring pattern 32 includes a first region 32A, and a second region 32B connected to the first region 32A. A width of the first region 32A in a first direction on the mounting surface 31 is equal to or less than a predetermined value. Hereinafter, the predetermined value is referred to as a first value (first distance). The first direction may be the same direction as the short-side direction.

The first region 32A is provided on the mounting surface 31 with a predetermined length equal to or less than the first value in a second direction perpendicular to the first direction. Hereinafter, a value of the predetermined length is referred to as a second value (second distance). It can be said that the first region 32A is a region having the width in the first direction being equal to or less than the first value, and having the length in the second direction being the second value. The width in the first direction being equal to or less than the first value indicates that the width of the first region 32A in the first direction may not be constant. Note that the width of the first region 32A in the first direction may be constant at the first value. In the illustrated submount 30, the first region 32A can be a rectangular region, the first value can be a dimension corresponding to a short side of the rectangle, and the second value can be a dimension corresponding to a long side of the rectangle.

Since the second region 32B is connected to the first region 32A, a boundary B is present between the first region 32A and the second region 32B. Hereinafter, any point on the boundary B is referred to as a first position. The second region 32B is connected to the first region 32A at the first position. The first region 32A is a region extending from the first position by the second value in the second direction. In other words, a distance between the first position and the distal end of the first region in the second direction is the second value (the second distance). In the illustrated submount 30, the second direction is the same direction as the positive direction of Y.

A width of the second region 32B in the first direction is greater than the width of the first region 32A in the first direction in the first position. The maximum width of the second region 32B in the first direction on the mounting surface 31 is equal to or less than a predetermined value. Hereinafter, the predetermined value is referred to as a third value (third distance). It can be said that the third value is greater than the width of the first region 32A in the first direction in the first position. Further, the third value is greater than the first value.

The second region 32B extends in the second direction from the first position toward an opposite side of the first region 32A with a length equal to or less than the third value. The second region 32B is arranged on an opposite side of the first region 32A with respect to the first position in the top view. The second region 32B is provided on the mounting surface 31 with a predetermined length equal to or less than the third value in the second direction toward the opposite side of the first region 32A. Hereinafter, a value of the predetermined length is referred to as a fourth value (fourth distance). The fourth value is less than the second value. Note that the width of the second region 32B in the first direction may be constant at the third value. In the illustrated submount 30, the second region 32B can be a rectangular region, the third value can be a dimension corresponding to a long side of the rectangle, and the fourth value can be a dimension corresponding to a short side of the rectangle. Further, the direction toward the opposite side of the first region 32A in the second direction is the same direction as the negative direction of Y.

An outer edge of the first metal layer 34 is located inside an outer edge of the substrate 33. In this case, the upper surface of the submount 30 includes not only the upper surface of the first metal layer 34 and the upper surface of the wiring pattern 32 that constitute the mounting surface 31 but also the upper surface of the substrate 33. For a distinction of the upper surface of the submount 30, the upper surface constituting the mounting surface 31 may be referred to as a first upper surface of the submount 30, and an upper surface intersecting an outer edge of the submount 30 in the top view may be referred to as a second upper surface of the submount 30. Note that, in a case of a submount such that a mounting surface intersects an outer edge of the submount in the top view, a first upper surface and a second upper surface indicate the same upper surface.

In the top view, a part (hereinafter, referred to as a first outer edge portion) of an outer edge of the wiring pattern 32 is located in a vicinity of an outer edge of the mounting surface 31 of the submount 30. Note that the vicinity herein may be defined as being located within 10 μm (including 0). In the top view, the first outer edge portion of the wiring pattern 32 is located in a vicinity of the outer edge of the upper surface of the submount 30. Note that the vicinity herein may be defined as being located within 50 μm (including 0). The first outer edge portion is included in the first region 32A.

In the top view, another part (hereinafter, referred to as a second outer edge portion) of the outer edge of the wiring pattern 32 is located in a vicinity of the outer edge of the mounting surface 31 of the submount 30. Note that the vicinity herein may be defined as being located within 10 μm (including 0). In the top view, the second outer edge portion of the wiring pattern 32 is located in a vicinity of the outer edge of the upper surface of the submount 30. Note that the vicinity herein may be defined as being located within 50 μm (including 0). The second outer edge portion is included in the second region 32B.

For example, the length of the submount 30 in the short-side direction is in a range from 700 μm to 900 μm. The length of the submount 30 in the long-side direction is in a range from 1400 μm to 1850 μm. A difference between the length of the submount 30 in the long-side direction and the length in the short-side direction is in a range from 600 μm to 1050 μm.

For example, the length of the first region 32A in the first direction is in a range from 200 μm to 400 μm. The length of the first region 32A in the second direction is in a range from 1000 μm to 1300 μm. The length of the second region 32B in the first direction is in a range from 400 μm to 600 μm. The length of the second region 32B in the second direction is in a range from 200 μm to 400 μm.

A distance from the outer edge of the mounting surface 31 located in the vicinity of the first outer edge portion to the outer edge of the upper surface of the submount 30 may be in a range from 0 μm to 100 μm. Alternatively, the distance may be in a range from 0 μm to 70 μm. Alternatively, the distance may be in a range from 0 μm to 50 μm.

For example, a length of the wiring pattern 32 in the second direction may be in a range from 85% to 100% of the length of the submount 30 in the second direction. The length of the first region 32A in the first direction may be in a range from 20% to 50% of the length of the submount 30 in the first direction. The length of the second region 32B in the first direction may be in a range from 55% to 85% of the length of the submount 30 in the first direction. A difference between the length of the second region 32B in the first direction and the length of the first region 32A in the first direction may be in a range from 15% to 45% of the length of the submount 30 in the first direction.

As illustrated in the drawings, the wiring pattern 32 has an L shape in the top view. Note that the L shape herein may be a shape acquired by inverting L. One rod-like shape of two rod-like shapes constituting the L shape may be a shape of the first region 32A, and the other rod-like shape may be a shape of the second region 32B. A straight line parallel to the first direction that can divide the L shape into the two rod-like shapes is the boundary B between the first region 32A and the second region 32B.

The wiring pattern 32 can be formed of a metal. For example, the wiring pattern 32 can be formed by forming AuSn solder (a metal layer of AuSn) on a metal layer of Ti/Pt/Au (layered in an order of Ti, Pt, and Au from the upper surface of the submount 30). Note that the configuration of the wiring pattern 32 is not limited thereto.

Reflective Member 40

The reflective member 40 includes a lower surface, and a light reflective surface that reflects light. The light reflective surface is inclined to the lower surface. In other words, the light reflective surface is not perpendicular nor parallel in an arrangement relationship when viewed along the lower surface. A straight line connecting a lower end and an upper end of the light reflective surface is inclined to the lower surface of the reflective member 40. An angle of the light reflective surface with respect to the lower surface, or an angle of the straight line connecting the lower end and the upper end of the light reflective surface with respect to the lower surface is referred to as an inclination angle of the light reflective surface.

In the illustrated reflective member 40, the light reflective surface is a flat surface and forms an inclination angle of 45 degrees with respect to the lower surface of the reflective member 40. Note that the light reflective surface is not limited to a flat surface, and may be, for example, a curved surface. Further, the light reflective surface may not have an inclination angle of 45 degrees.

For the reflective member 40, glass, metal, or the like can be used as a main material. As the main material, a heat-resistant material is preferable, and for example, glass such as quartz or BK7 (borosilicate glass), or a metal such as aluminum can be employed. The reflective member 40 can also be formed using Si as the main material. When the main material is a reflective material, the light reflective surface can be formed of the main material. When the light reflective surface is formed of a material different from the main material, the light reflective surface can be formed using, for example, metal such as Ag or Al, or a dielectric multilayer film such as $Ta_2O_5/SiO_2$, $TiO_2/SiO_2$, and $Nb_2O_5/SiO_2$.

In the light reflective surface, a reflectance to the peak wavelength of the light applied to the light reflective surface is equal to or more than 90%. The reflectance may be equal to or more than 95%. The reflectance can be equal to or more than 99%. The light reflectance is equal to or less than 100%, or is less than 100%.

Protective Element 50

The protective element 50 prevents breakage of a specific element (the semiconductor laser element, for example) as a result of an excessive current flowing through the element. The protective element 50 is a Zener diode, for example. Further, a Zener diode formed of Si can be used as the Zener diode.

Lid Member 60

The lid member 60 includes a lower surface and an upper surface, and is formed in a flat plate-like rectangular parallelepiped shape. Note that the shape of the lid member 60 may not be the rectangular parallelepiped shape. The lid member 60 has transmissivity that transmits light. Here, "having light transmissivity" means that the light transmittance is equal to or more than 80%. Note that the light transmittance with respect to all wavelengths may not be equal to or more than 80%. The lid member 60 may partially include a non-light transmissive region (a region that does not have transmissivity).

The lid member 60 is formed by using glass as a main material. The main material forming the lid member 60 is a material having high transmissivity. The lid member 60 is not limited to glass, and may be formed by using sapphire as the main material, for example.

Lens Member 70

The lens member 70 includes an upper surface, a lower surface, and a lateral surface. The lens member 70 provides, to incident light, optical action such as condensation, diffusion, and collimation, and the light provided with the optical action is emitted from the lens member 70.

The lens member 70 includes one or a plurality of lens surfaces. The one or the plurality of lens surfaces are provided on the upper surface side of the lens member 70. Note that the one or the plurality of lens surfaces may be provided on the lower surface side of the lens member 70. The upper surface and the lower surface are flat surfaces. The one or the plurality of lens surfaces intersect the upper surface. The one or the plurality of lens surfaces are surrounded by the upper surface in the top view. In the top view, the lens member 70 has a rectangular outer shape. The lower surface of the lens member 70 is rectangular.

Of the lens member 70, a portion overlapping the one or the plurality of lens surfaces is a lens portion, and a portion that does not overlap the one or the plurality of lens surfaces is a non-lens portion in the top view. In the lens member 70, a portion overlapping the upper surface in the top view is included in the non-lens portion. A lens surface side when the lens portion is divided into two in an imaginary plane including the upper surface is a lens-shape portion, and a lower surface side is a flat plate-like portion. The lower surface of the lens member 70 is formed of a lower surface of the lens portion and a lower surface of the non-lens portion.

The one or the plurality of lens surfaces of the lens member 70 are continuously formed in one direction. In other words, the one or the plurality of lens surfaces are provided such that the lens surfaces are connected to each other and are aligned in the same direction. The lens member 70 is formed such that a vertex of each of the lens surfaces is located on one imaginary straight line. In the illustrated lens member 70, the imaginary straight line is in the same direction as the X direction.

Here, in the top view, a direction in which the plurality of lens surfaces are aligned is referred to as a coupling direction. A length of the plurality of lens surfaces in the coupling direction is greater than a length in a direction perpendicular to the coupling direction in the top view. In the illustrated lens member 70, the coupling direction is the same direction as the X direction.

The lens member 70 has transmissivity. The lens member 70 has transmissivity in both of the lens portion and the non-lens portion. The lens member 70 can be formed by using glass such as BK7, for example.

Next, the light-emitting device 100 will be described.

Light-Emitting Device 100

In the light-emitting device 100, the one or the plurality of semiconductor laser elements 20 are disposed on the base 10. The one or the plurality of semiconductor laser elements 20 are disposed on the mounting surface 11D of the base 10. The one or the plurality of semiconductor laser elements 20 are sealed in a package. The package forms a sealed space being an interior space in which the semiconductor laser element 20 is disposed. The package can be formed by bonding the lid member 60 to the base 10.

The semiconductor laser element 20 is mounted on the submount 30. The semiconductor laser element 20 is mounted on the mounting surface 11D of the base 10 via the submount 30. The lower surface of the submount 30 is bonded to the base 10. The second metal layer 35 of the submount 30 is bonded to the base 10.

The semiconductor laser element 20 is disposed on the wiring pattern 32 of the submount 30. The semiconductor laser element 20 is disposed in the first region 32A of the wiring pattern 32. The semiconductor laser element 20 is disposed such that the light emission surfaces are parallel to each other in the first direction. Note that the term "parallel" herein allows a difference within ±5°. The semiconductor laser element 20 is bonded to the wiring pattern 32 via a bonding material such as AuSn solder provided on the wiring pattern 32. For example, the semiconductor laser element 20 can be bonded on the wiring pattern 32 by using a eutectic reaction between the AuSn solder of the wiring pattern 32 and an Au metal film provided on the semiconductor laser element 20.

The semiconductor laser element 20 may be disposed such that a portion of the semiconductor laser element 20 protrudes from the mounting surface 31 of the submount 30 and the light emission surface is spaced apart from the mounting surface 31 in the top view. A length of a portion of the semiconductor laser element 20 protruding from the mounting surface 31 of the submount 30 may be equal to or less than 30 μm. When the protruding length increases, heat radiation performance of the submount 30 with respect to heat generated from the light emission surface of the semiconductor laser element 20 may be insufficient. More preferably, the length may be equal to or less than 20 μm.

The light emission surface of the semiconductor laser element 20 may be disposed between the outer edge of the mounting surface 31 and the outer edge of the upper surface of the submount 30 in the top view. In this way, the semiconductor laser element 20 does not protrude from the submount 30 in the top view, and thus a mounting region that needs to be ensured can be reduced in the second direction. Further, the semiconductor laser element 20 can be disposed such that a main portion of light emitted from the semiconductor laser element 20 is not incident on the upper surface of the submount 30 while considering heat dissipation of the semiconductor laser element 20.

The width of the first region 32A in the first direction is greater than a width of the semiconductor laser element 20 in the first direction. The width of the first region 32A in the first direction is greater than the width of the semiconductor laser element 20 in the first direction by over 100 μm. In this way, the semiconductor laser element 20 can be stably bonded on the wiring pattern 32. Note that the width of the first region 32A in the first direction is preferably equal to or less than a value acquired by adding 200 μm to the width of the semiconductor laser element 20 in the first direction. A greater mounting region of the other components can be ensured by suppressing a size of the wiring pattern 32.

In the top view, one end of both ends of the width of the first region 32A in the first direction is located away from a lateral surface closer to the one end of both lateral surfaces intersecting the light emission surface of the semiconductor laser element 20 by more than 50 μm and 100 μm or less, and the other end is located away from a lateral surface closer to the other end by more than 50 μm and 100 μm or less. In this way, the semiconductor laser element 20 can be stably bonded on the wiring pattern 32. Further, the center of the width of the first region 32A in the first direction and the center of the width of the semiconductor laser element 20 in the first direction may coincide with each other.

The length (second value) of the first region 32A in the second direction is equal to or more than a value acquired by subtracting the length of a portion of the semiconductor laser element 20 protruding from the mounting surface 31 such that the light emission surface is spaced apart from the mounting surface 31 in the top view from a length of the semiconductor laser element 20 in the second direction. Further, the second value may be equal to or less than a value acquired by adding 50 μm to the value acquired by subtracting the length of the portion of the light emission surface of the semiconductor laser element 20 protruding from the mounting surface 31 in the top view from the length of the semiconductor laser element 20 in the second direction. Based on the length of the semiconductor laser element 20 in the second direction, the length of the first region 32A in the second direction is not excessively sufficient, and thus the length of the submount 30 in the second direction can be suppressed. Note that the second value may be equal to or less than the length of the semiconductor laser element 20 in the second direction. In other words, the semiconductor laser element 20 may be disposed in a position through which the boundary B passes in the top view.

Here, a lateral surface of the first metal layer 34 located in a vicinity of the light emission surface of the semiconductor laser element 20 is referred to as a first lateral surface 34A of the first metal layer 34. A lateral surface of the first metal layer 34 on an opposite side to the first lateral surface 34A is referred to as a second lateral surface 34B of the first metal layer 34. Further, a lateral surface of the substrate 33 located in the vicinity of the light emission surface is referred to as a first lateral surface 33A of the substrate 33. A lateral surface of the substrate 33 on an opposite side to the first lateral surface 33A is referred to as a second lateral surface 33B of the substrate 33. Note that a first lateral surface and a second lateral surface of the submount 30 are referred to as the first lateral surface 33A and the second lateral surface 33B of the substrate 33 regardless of whether or not the submount 30 includes the first metal layer.

The first lateral surface 33A and the second lateral surface 33B of the substrate 33 are lateral surfaces extending in the short-side direction of the submount 30 in the top view. The first lateral surface 34A and the second lateral surface 34B of the first metal layer 34 are lateral surfaces extending in the short-side direction of the submount 30 in the top view. The semiconductor laser element 20 disposed on the submount 30 has a length in the second direction greater than the width in the first direction.

The first outer edge portion of the wiring pattern 32 is located in a vicinity of the first lateral surface 34A of the first metal layer 34 in the top view. The first outer edge portion of the wiring pattern 32 is located in a vicinity of the first lateral surface of the submount 30 in the top view. The first outer edge portion of the wiring pattern 32 is located in the vicinity of the light emission surface of the semiconductor laser element 20 in the top view. The light emission surface of the semiconductor laser element 20 is parallel to the first lateral surface of the submount 30.

In the top view, the second outer edge portion of the wiring pattern 32 includes a first portion located in a vicinity of the second lateral surface 34B of the first metal layer 34, and a second portion located in a vicinity of the lateral surface of the first metal layer 34 intersecting the second lateral surface 34B. In the top view, the second outer edge portion of the wiring pattern 32 includes a first portion located in a vicinity of the second lateral surface of the submount 30, and a second portion located in a vicinity of the lateral surface intersecting the second lateral surface of the submount 30. A length of the first portion in the first direction may be equal to the third value. A length of the second portion in the second direction may be the fourth value.

In the light-emitting device 100, the one or the plurality of protective elements 50 are disposed on the mounting surface 11D. The one or the plurality of protective elements

50 are sealed in a package. The protective element 50 is mounted on the submount 30. The protective element 50 is mounted on the mounting surface 11D via the submount 30.

The protective element 50 is disposed on the wiring pattern 32 of the submount 30. The protective element 50 is disposed in the second region 32B of the wiring pattern 32. In the top view, any imaginary line passing through the protective element 50 in parallel with the first direction does not pass through the semiconductor laser element 20 disposed on the submount 30 together with the protective element 50.

In the semiconductor laser element 20 and the protective element 50 disposed on the submount 30, a width in the first direction of the protective element 50 is greater than that of the semiconductor laser element 20. Further, a length in the second direction of the protective element 50 is smaller than that of the semiconductor laser element 20.

An interval in the second direction between the semiconductor laser element 20 and the protective element 50 disposed on the submount 30 is greater than 0 μm and less than 170 μm. The less interval can reduce a mounting region in the second direction required for disposing the semiconductor laser element 20 and the protective element 50. Therefore, the interval is more preferably greater than 0 μm and 120 μm or less. Further, the interval is more preferably greater than 0 μm and 100 μm or less. Further, the interval is more preferably greater than 0 μm and 80 μm or less.

When the semiconductor laser element 20 and the protective element 50 are in contact with each other, there is a risk of conduction at an unintended place. The semiconductor laser element 20 and the protective element 50 can be theoretically set closer to each other to the utmost as long as the contact is avoided. However, when facilitating a determination whether the contact is made is considered, the interval in the second direction between the semiconductor laser element 20 and the protective element 50 disposed on the submount 30 may be equal to or more than 50 μm. Therefore, the interval may be 50 μm or more, and less than 170 μm. The interval may be in a range from 50 μm to 120 μm. The interval may be in a range from 50 μm to 100 μm. The interval may be in a range from 50 μm to 80 μm.

Here, the explanation of bonding of the semiconductor laser element 20 will be supplemented. When the semiconductor laser element is bonded to the submount or the like, sufficient bonding strength is required such that the semiconductor laser element does not easily fall off due to a vibration or the like in a subsequent use of the light-emitting device. Further, from not only a viewpoint of acquiring the sufficient bonding strength such that the semiconductor laser element does not easily fall off but also a viewpoint of heat dissipation with respect to the semiconductor laser element, whether a bonding state is sufficient may be determined. In the semiconductor laser element, main light is emitted from the light emission surface, and further, a part of the light is also emitted from a surface on an opposite side to the light emission surface. Thus, heat generated in the semiconductor laser element is concentrated on the light emission surface and the surface on the opposite side. Therefore, when quality of a bonding state is determined from the viewpoint of the heat dissipation, a bonding state in the vicinity of the light emission surface and a vicinity of the surface on the opposite side is an important element.

For example, when a metal film of Au is bonded by using AuSn solder, an insufficient eutectic reaction causes a decrease in heat dissipation. Then, it is found out from an experimental result that the eutectic reaction becomes insufficient when a distance from the semiconductor laser element to the outer edge of the wiring pattern is too short. Specifically, the eutectic reaction is sometimes insufficient when a bonding state is confirmed after the semiconductor laser element is bonded to a wiring pattern having the distance of 50 μm. Thus, although it is not preferable that the light emission surface of the semiconductor laser element 20 is located at a distance greater than 50 μm for another reason, the distance from the surface on the opposite side to the light emission surface to the outer edge of the wiring pattern is preferably greater than 50 μm. Thus, as illustrated in FIGS. 11 and 12, it is concluded that the interval in the second direction between the semiconductor laser element 20 and the protective element 50 is properly equal to or more than 170 μm when a wiring pattern 39 on which the semiconductor laser element 20 is disposed and the wiring pattern 39 on which the protective element 50 is disposed are separately provided.

Note that, as described above, FIGS. 11 and 12 are not given as a related art and are merely an example of considering a size reduction of the submount in the second direction by a form of separately providing the wiring pattern 39. In other words, the conclusion that the interval in the second direction between the semiconductor laser element 20 and the protective element 50 is preferably equal to or more than 170 μm in the case of FIGS. 11 and 12 does not mean that a technical boundary between the related art and the present embodiment is 170 μm. Therefore, a remark is also made that the present application is not the invention in which an insufficient eutectic reaction is an essential problem.

In contrast to the submount in FIG. 11, in the submount 30, the semiconductor laser element 20 and the protective element 50 are disposed on one wiring pattern 32, and the semiconductor laser element 20 and the protective element 50 are disposed apart from each other in the second direction, and thus the distance from the surface on the opposite side to the light emission surface of the semiconductor laser element 20 to the outer edge of the wiring pattern 32 can be ensured over 50 μm. Note that a length of the protective element 50 in the second direction is equal to or more than 50 μm. In order to suppress a mounting region to be small, the length of the protective element 50 in the second direction is preferably equal to or less than 300 μm. Similarly, a length of the protective element 50 in the first direction is preferably equal to or less than 300 μm.

An interval in the first direction between the semiconductor laser element 20 and the protective element 50 disposed on the submount 30 is in a range from 0 μm to 100 μm. The less interval can reduce a mounting region in the first direction required for disposing the semiconductor laser element 20 and the protective element 50. The interval is preferably in a range from 0 μm to 50 μm. Note that the interval of 0 μm includes not only a state where a straight line connecting an end point of the semiconductor laser element 20 on the protective element 50 side and an end point of the protective element 50 on the semiconductor laser element 20 side is parallel to the second direction but also a state where an imaginary line passing through the semiconductor laser element 20 and the protective element 50 in parallel with the second direction is present.

The protective element 50 is disposed in a position not passed by an imaginary line L1 that is parallel to the second direction and passes through an emission point (light-emitting point) of light emitted from the light emission surface of the semiconductor laser element 20 in the top view. With such an arrangement, light emitted from the surface on the opposite side to the light emission surface of the semiconductor laser element 20 being reflected by the lateral surface of the protective element 50 to return to the semiconductor laser element 20 can be suppressed. In the light-emitting device 100, the semiconductor laser element 20 and the protective element 50 can be disposed such that the interval in the first direction between the semiconductor laser element 20 and the protective element 50 disposed on the submount 30 exceeds 0 μm. In this way, an effect of suppressing return light can be further increased.

Note that, as illustrated in FIGS. 13 and 14, the protective element 50 may be disposed in a position passed by the imaginary line L1 that is parallel to the second direction and passes through the light-emitting point of the light emission surface of the semiconductor laser element 20 in the top view. In the first direction, both ends of the semiconductor laser element 20 may be located between both ends of the protective element 50. In a side view viewed along the second direction, the light emission surface and the surface on the opposite side to the light emission surface of the semiconductor laser element 20 may be included in the lateral surface of the protective element 50. In this way, a width in the first direction of a mounting region for mounting the semiconductor laser element 20 and the protective element 50 can be reduced. Note that, when the semiconductor laser element 20 and the protective element 50 are disposed in such a manner, a bulge of a bonding material between the surface on the opposite side to the light emission surface of the semiconductor laser element 20 and the lateral surface of the protective element 50 is concerned, but, as a result of an experiment, a bulge such that a current leak occurs was not confirmed.

The protective element 50 is disposed in a position passed by an imaginary line L2. The imaginary line L2 passes through a point P (first point) and is parallel to the second direction. At the point P, an outer edge of the first region 32A extending in the second direction and an outer edge of the second region 32B extending in the first direction intersect each other, and the point P intersects the boundary B. In this way, a mounting region required for mounting the semiconductor laser element 20 and the protective element 50 can be reduced, and a size of the first region 32A of the wiring pattern 32 can also be reduced.

The protective element 50 is disposed at a distance in a range from 100 μm to the first portion of the second outer edge portion of the submount 30. The protective element 50 may be disposed at a distance in a range from 50 μm to the first portion of the second outer edge portion of the submount 30. The protective element 50 may be disposed at a distance in a range from 100 μm or less from the second lateral surface of the submount 30. In this way, the length of the submount 30 in the second direction can be reduced. The protective element 50 is disposed at a distance in a range from 100 μm to the second portion of the second outer edge portion of the submount 30. In this way, the length of the submount 30 in the first direction can be reduced.

The interval in the second direction between the semiconductor laser element 20 and the protective element 50 disposed on the submount 30 may be less than the distance from the protective element 50 to the second lateral surface of the submount 30. A difference between the interval in the second direction between the semiconductor laser element 20 and the protective element 50 disposed on the submount 30 and the distance from the protective element 50 to the second lateral surface of the submount 30 may be equal to or less than 30 μm. In this way, the length of the submount 30 in the second direction can be reduced.

In the top view, the protective element 50 is disposed such that the lateral surface facing the first portion of the second outer edge portion of the submount 30 is parallel to the first portion. In the top view, the protective element 50 is disposed such that the lateral surface facing the second portion of the second outer edge portion of the submount 30 is parallel to the second portion. Note that the term "parallel" herein allows a difference within ±10°.

In the light-emitting device 100, the one or the plurality of semiconductor laser elements 20 are disposed on the submounts 30 different from each other. Further, the one or the plurality of protective elements 50 are disposed on the submounts 30 different from each other. The number of the semiconductor laser elements 20 disposed on one submount 30 is one, and the number of the protective elements 50 disposed on one submount 30 is equal to or less than one. The protective element 50 may not be disposed on all of the submounts 30 on which the semiconductor laser element 20 is disposed. In the illustrated light-emitting device 100, the protective element 50 is disposed on all of the submounts 30 on which the semiconductor laser element 20 is disposed.

The light-emitting device 100 may include the plurality of semiconductor laser elements 20. Further, the plurality of semiconductor laser elements 20 may be disposed side by side. When the submount 30 on which the semiconductor laser element 20 is disposed is one chip on submount (CoS), a plurality of the CoSs may be disposed side by side in the first direction in the light-emitting device 100. The protective element 50 is disposed in each of the plurality of CoSs aligned in the first direction. The plurality of submounts 30 are mounted on the mounting surface 11D of the base 10.

Each of the plurality of semiconductor laser elements 20 emits light in the second direction. Light of the FFP having a direction perpendicular to the mounting surface 11D as a fast axis direction is emitted from each of the light emission surfaces of the plurality of semiconductor laser elements 20. All of the semiconductor laser elements 20 have a divergence angle of 20 degrees or less in a slow axis direction. Note that the divergence angle is an angle greater than 0 degrees.

In the light-emitting device 100 in which the plurality of CoSs are disposed side by side in the first direction, it may be more desirable that the submount 30 can be reduced in size in the first direction than in the second direction. The reason is that there is a possibility that the number of the CoSs that can be disposed side by side increases by reducing a width of the submount 30 with respect to a mounting region having the same width in the first direction. By disposing the semiconductor laser element 20 and the protective element 50 on the submount 30 away from each other in the second direction, the width in the first direction is easily reduced.

Further, when the number of the CoSs that can be disposed side by side is great, a size reduction per one submount 30 also has a great influence on an increase in the number of the CoSs that can be disposed. Thus, in the light-emitting device 100, four or more CoSs are preferably disposed side by side in the first direction. The illustrated light-emitting device 100 is an example of a light-emitting device in which five or more CoSs are disposed side by side in the first direction.

In the light-emitting device 100, the one or the plurality of reflective members 40 are disposed on the base 10. Each of the reflective members 40 is disposed on the mounting surface 11D. Light emitted from the one or the plurality of semiconductor laser elements 20 is reflected by the light reflective surface of the one or the plurality of reflective members 40. The light reflective surface is inclined to a traveling direction of light passing through an optical axis at an angle of 45 degrees. The light reflected by the light reflective surface travels upward.

The reflective member 40 can be provided in a one-to-one relationship with the semiconductor laser element 20. In other words, the reflective members 40 in the same number as the number of the semiconductor laser elements 20 may be disposed. In the light-emitting device 100, the plurality of reflective members 40 may be disposed side by side in the first direction in the top view. All of the reflective members 40 have the same size and shape.

The light reflective surface of the reflective member 40 reflects 90% or more of a main portion of applied light. Note that one reflective member 40 may be provided for the plurality of semiconductor laser elements 20. Alternatively, the light-emitting device 100 may not include the reflective member 40.

In the light-emitting device 100, the lid member 60 is bonded to the base 10. The lid member 60 is disposed on the upper surface 11A of the base 10. Further, the lid member 60 is located above the stepped portion 12C. As a result of the lid member 60 being bonded to the base 10, a closed space defined by the base 10 and the lid member 60 is generated. This space is a space in which the semiconductor laser element 20 is disposed.

By bonding the lid member 60 to the base 10 under a predetermined atmosphere, a hermetically sealed closed space (sealed space) is created. By hermetically sealing the space in which the semiconductor laser element 20 is disposed, a deterioration in quality due to dust gathering can be suppressed. The lid member 60 has transmissivity with respect to light emitted from the semiconductor laser element 20. 90% or more of a main portion of the light emitted from the semiconductor laser element 20 is emitted to the outside through the lid member 60.

In the light-emitting device 100, the lens member 70 is fixed to a package. The lens member 70 is disposed above the lid member 60. The lens member 70 is bonded to the lid member 60. Light emitted from each of the plurality of semiconductor laser elements 20 is emitted from the package and incident on the lens member 70. The light transmitted through the lid member 60 is incident on an incident surface of the lens member 70. The light incident on the incident surface of the lens member 70 is emitted from the lens surface.

The lens member 70 includes the lens surfaces in the same number as the number of the one or the plurality of semiconductor laser elements 20. Each of the lens surfaces of the lens member 70 corresponds to a different semiconductor laser element 20, and light emitted from the semiconductor laser element 20 passes through the corresponding lens surface. A main portion of the light emitted from each of the semiconductor laser elements 20 passes through a different lens surface and is emitted from the lens member 70. The light incident on the lens member 70 is emitted from the lens member 70 as collimated light, for example.

Second Embodiment

Figure 15:
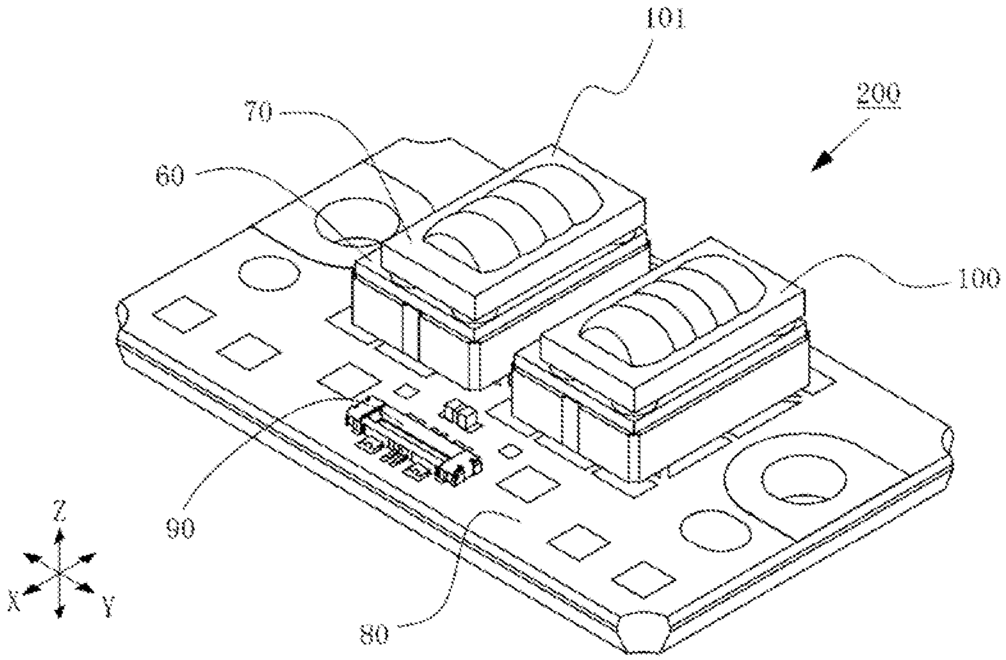
FIG. 15 is a perspective view of a light-emitting module according to a second embodiment.
Figure 16:
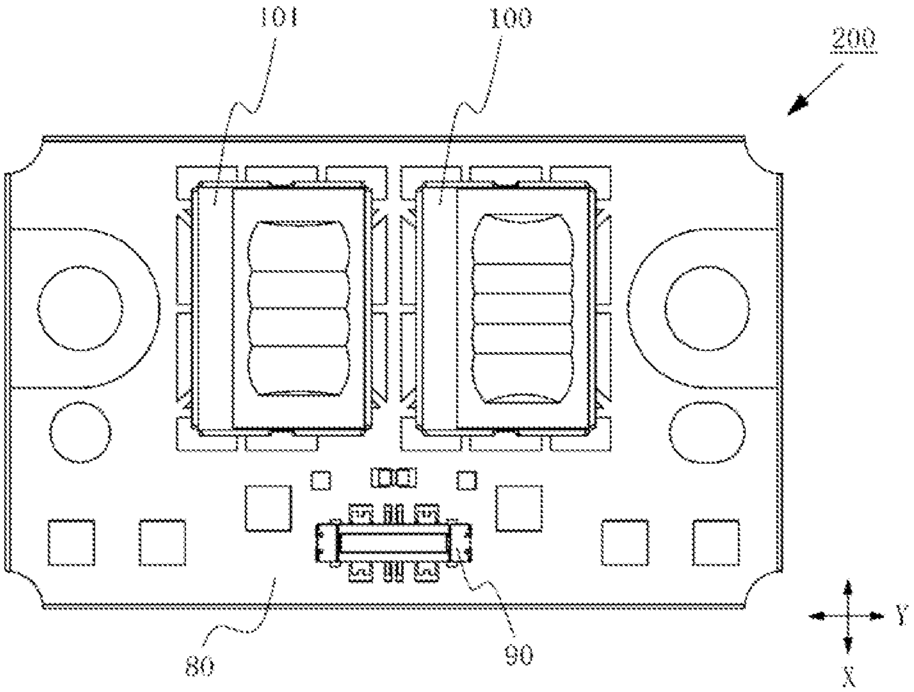
FIG. 16 is a top view of the light-emitting module according to the second embodiment.
Figure 17:
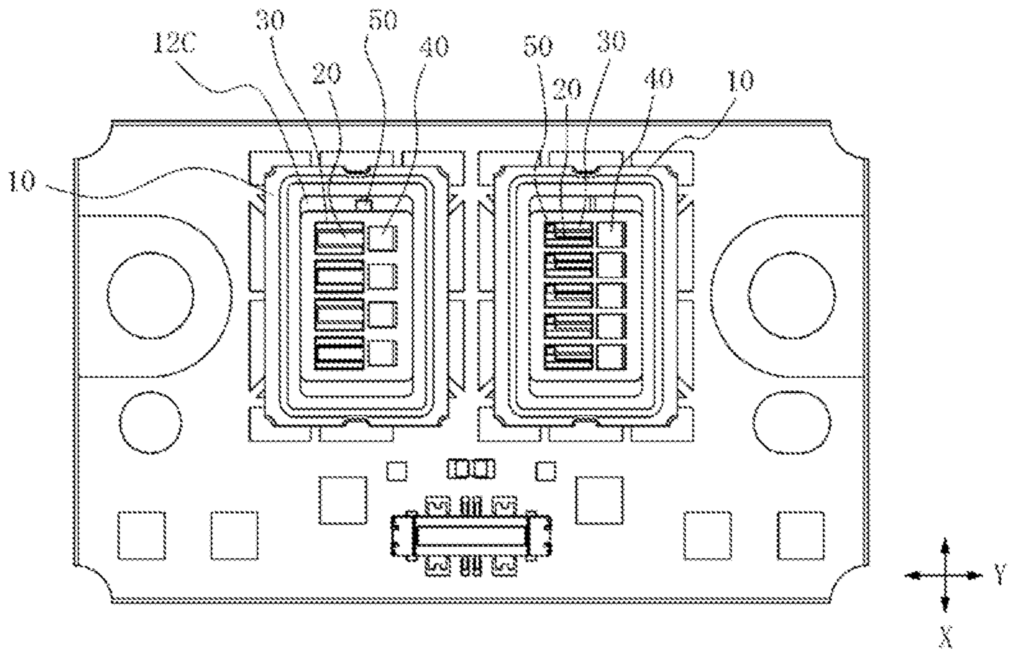
FIG. 17 is a top view illustrating each component disposed inside the light-emitting device included in the light-emitting module according to the second embodiment.

Next, a light-emitting module 200 according to a second embodiment will be described. FIGS. 15 to 17 are drawings illustrating an exemplary form of the light-emitting module 200. Since the light-emitting module 200 includes the light-emitting device 100, it can also be said that FIGS. 1 to 14 are drawings illustrating the light-emitting module 200. FIG. 15 is a perspective view of the light-emitting module 200. FIG. 16 is a top view of the light-emitting module 200. FIG. 17 is a top view illustrating each component disposed inside the light-emitting device included in the light-emitting module 200.

The light-emitting module 200 includes a plurality of the components. The plurality of components included in the light-emitting module 200 include the light-emitting device 100 (hereinafter, referred to as a first light-emitting device 100), a second light-emitting device 101, a wiring substrate 80, and a connector 90. Note that the light-emitting module 200 may include a component other than the plurality of components described above, or may not include some components.

Hereinafter, in order to distinguish components having common names to the first light-emitting device 100 and the second light-emitting device 101, the components of the first light-emitting device 100 are provided with "first", and the components of the second light-emitting device 101 are provided with "second".

The second light-emitting device 101 includes a plurality of the components. The plurality of components included in the second light-emitting device 101 include a second base 10, one or a plurality of second semiconductor laser elements 20, one or a plurality of second submounts 30, one or a plurality of second reflective members 40, one or a plurality of second protective elements 50, a second lid member 60, and a second lens member 70.

All descriptions related to the light-emitting device 100 and each of the components according to the first embodiment described above apply to the description of the second light-emitting device 101 except for the description in which it can be said that contents are inconsistent from the second light-emitting device 101 disclosed by the drawings and the following description according to the light-emitting module 200. All contents not inconsistent with the previously described contents will not be described again in order to avoid duplication.

Light-Emitting Module 200

In the light-emitting module 200, the first light-emitting device 100 and the second light-emitting device 101 are mounted on the wiring substrate 80. The first light-emitting device 100 includes a first package, and the second light-emitting device 101 includes a second package. Further, the first package and the second package are each bonded to the wiring substrate 80. Both of the first package and the second package can be formed by bonding the lid member 60 to the base 10.

The first package of the first light-emitting device 100 and the second package of the second light-emitting device 101 have the same outer shape. Note that a fact that a smallest rectangle including the first package and a smallest rectangle including the second package have the same shape in the top view, and the first package and the second package have the same height may be included in an interpretation of "the same outer shape of the first package and the second package."

An area of a first mounting surface 11D of the first light-emitting device 100 is in a range from 90% to 110% of an area of a second mounting surface 11D of the second light-emitting device 101. The area of the first mounting surface 11D may be the same as the area of the second mounting surface 11D. The first mounting surface 11D and the second mounting surface 11D may have the same shape.

The first light-emitting device 100 includes a plurality of first semiconductor laser elements 20. Further, the plurality of first semiconductor laser elements 20 include the semiconductor laser element 20 disposed on the submount 30 according to the first embodiment.

The first light-emitting device 100 includes a plurality of first submounts 30. The plurality of first submounts 30 include the submount 30 according to the first embodiment. The first semiconductor laser element 20 is disposed on each of the plurality of first submounts 30. All of the plurality of first semiconductor laser elements 20 may be the semiconductor laser element 20 disposed on the submount 30 according to the first embodiment.

The second light-emitting device 101 includes the one or the plurality of second semiconductor laser elements 20. The number of the second semiconductor laser elements 20 included in the second light-emitting device 101 is less than the number of the first semiconductor laser elements 20 included in the first light-emitting device 100 by one or more. Note that the first light-emitting device 100 does not include the semiconductor laser element 20 other than the plurality of first semiconductor laser elements 20. The second light-emitting device 101 does not include the semiconductor laser element 20 other than the one or the plurality of second semiconductor laser elements 20.

The second light-emitting device 101 includes the one or the plurality of second submounts 30. All of the one or the plurality of second submounts 30 have a shape different from that of the submount 30 according to the first embodiment. The second semiconductor laser element 20 is disposed on each of the one or the plurality of second submounts 30.

In the top view, a length of the second submount 30 in a direction parallel to a light emission surface of the second semiconductor laser element 20 is greater than a length of the first submount 30 in a direction parallel to a light emission surface of the first semiconductor laser element 20. A difference between the length of the second submount 30 in the direction parallel to the light emission surface of the second semiconductor laser element 20 and the length of the first submount 30 in the direction parallel to the light emission surface of the first semiconductor laser element 20 may be in a range from 70 μm to 190 μm.

Each of the plurality of first semiconductor laser elements 20 emits light (hereinafter, referred to as first light) of a first color. Note that the plurality of first semiconductor laser elements 20 may include the semiconductor laser element 20 that emits light of a color different from that of the first light. The first color is, for example, blue. Note that the first color may not be blue.

The one or the plurality of second semiconductor laser elements 20 include the semiconductor laser element 20 that emits light (hereinafter, referred to as second light) of a second color. The second light is light of a color different from that of the first light. Further, the second light may have a color different from the color of the light emitted from all of the plurality of first semiconductor laser elements 20. The second color is, for example, red. Note that the second color may not be red.

Red, green, and blue light may be emitted by the first light-emitting device 100 and the second light-emitting device 101.

In the top view, a width of the light emission surface of the second semiconductor laser element 20 in the first direction is greater than a width of the light emission surface of the first semiconductor laser element 20. In this way, the widths of the light emission surfaces are different from each other, and thus the first submount 30 on which the first semiconductor laser element 20 is disposed and the second submount on which the second semiconductor laser element 20 is disposed may have different shapes.

Based on the illustrated light-emitting module 200, when the first semiconductor laser element 20 and the second semiconductor laser element 20 are disposed on submounts having the same shape, the number of the semiconductor laser elements 20 included in each of the first light-emitting device 100 and the second light-emitting device 101 is four. On the other hand, the light-emitting module 200 employs, for the first light-emitting device 100, the first submount 30 that can be disposed side by side in five rows instead of the second submount 30 that can be disposed side by side in only four rows. In this way, by reducing a mounting region per one submount in the first direction, mounting regions required for disposing the plurality of submounts can be reduced in the first direction, and a greater number of the submounts can be aligned.

On the other hand, as a result of disposing the protective element 50 and the semiconductor laser element 20 away from each other in the second direction in order to reduce the mounting region in the first direction, the mounting region increases in the second direction. When the mounting direction increases in the second direction, an interval between an inner lateral surface 11E of the base 10 and the submount 30 becomes narrow, and mounting may become difficult. Thus, it is also desirable that the length is suppressed such that a size of the submount 30 does not excessively increase in the second direction. The submount 30 and the light-emitting device 100 according to the first embodiment, and the light-emitting module 200 that properly uses the submount 30 are one form effective for such a purpose.

In the second light-emitting device 101, the second protective element 50 is mounted on the second package. The second protective element 50 is disposed on an upper surface of a stepped portion 12C of the base 10 of the second package. In the second light-emitting device 101, the second protective element 50 is not disposed on the second submount 30. In other words, the second protective element 50 is not disposed on any of the one or the plurality of second submounts 30. In contrast to the submount 30 according to the first embodiment, a wiring pattern in the second submount 30 does not have a shape including the first region 32A and the second region 32B. For example, the second semiconductor laser element 20 is disposed on a rectangular wiring pattern provided on the second submount 30.

In the light-emitting module 200, the first light-emitting device 100 and the second light-emitting device 101 are disposed side by side. A direction in which the first light-emitting device 100 and the second light-emitting device 101 are aligned is perpendicular to a direction in which the plurality of first semiconductor laser elements 20 are aligned in the first light-emitting device 100. By using the packages having the same outer shape, a size of the wiring substrate 80 can be suppressed.

In the light-emitting module 200, the connector 90 electrically connected to the first light-emitting device 100 and the second light-emitting device 101 is mounted on the wiring substrate 80. In this way, power supply to the first light-emitting device 100 and the second light-emitting device 101 can be easily performed.

Although each of the embodiments according to the present invention has been described above, the light-emitting device and the light-emitting module according to the present invention are not strictly limited to the light-emitting device and the mounted member in each of the embodiments. In other words, the present invention can be achieved without being limited to an outer shape or a structure of the light-emitting device and the light-emitting module disclosed by each of the embodiments. The present invention may be applied without requiring all the components being sufficiently provided. For example, in a case in which some of the components of the light-emitting device and the light-emitting module disclosed by the embodiments are not stated in the scope of the claims, the degree of freedom in design by those skilled in the art such as substitutions, omissions, shape modifications, and material changes for those components is allowed, and then the invention stated in the scope of the claims being applied to those components is specified.

Throughout the contents described in this description, the following Aspects are disclosed.

Aspect 1

A light-emitting device including: a submount including a mounting surface, and a wiring pattern provided on the mounting surface; a semiconductor laser element disposed on the wiring pattern; and a protective element disposed on the wiring pattern, wherein the wiring pattern includes a first region, and a second region connected to the first region, the first region extends from a first position on the mounting surface to a second value in a second direction perpendicular to a first direction, the first region having a width on the mounting surface in the first direction being greater than a width of the semiconductor laser element in the first direction and equal to or less than a first value, the first region having a width in the second direction being the second value, the second region extends from the first position in a direction opposite to the second direction at a width in the first direction greater than a width of the first region in the first direction in the first position, the semiconductor laser element is disposed in the first region, the protective element is disposed in the second region, and an interval in the second direction between the semiconductor laser element and the protective element is greater than 0 μm and less than 170 μm.

Aspect 2

The light-emitting device according to Aspect 1, wherein the second value is equal to or more than a value acquired by subtracting a length of a light emission surface of the semiconductor laser element protruding from the mounting surface of the submount in a top view from a length of the semiconductor laser element in the second direction.

Aspect 3

The light-emitting device according to Aspect 1 or 2, wherein the protective element is disposed in a position not passed by an imaginary line that passes through a light-emitting point of the semiconductor laser element and is parallel to the second direction in the top view.

Aspect 4

The light-emitting device according to any one of Aspects 1 to 3, wherein the protective element has a width in the first direction greater than a width of the semiconductor laser element, and the protective element has a width in the second direction less than a width of the semiconductor laser element.

Aspect 5

The light-emitting device according to any one of Aspects 1 to 4, wherein an interval in the second direction between the semiconductor laser element and the protective element is in a range from 50 μm to 100 μm.

Aspect 6

The light-emitting device according to any one of Aspects 1 to 5, wherein an interval in the second direction between the semiconductor laser element and the protective element is greater than 0 μm and 80 μm or less.

Aspect 7

The light-emitting device according to any one of Aspects 1 to 6, wherein a plurality of the submounts on which the semiconductor laser element and the protective element are disposed are disposed side by side in the first direction.

Aspect 8

A light-emitting module including: a first light-emitting device including a first package; a second light-emitting device including a second package; and a wiring substrate on which the first light-emitting device and the second light-emitting device are mounted, wherein the first light-emitting device is the light-emitting device according to any one of Aspects 1 to 7, and includes a plurality of first semiconductor laser elements including the semiconductor laser element, the second light-emitting device includes one or a plurality of second semiconductor laser elements, and the number of the second semiconductor laser elements included in the second light-emitting device is less than the number of the first semiconductor laser elements included in the first light-emitting device by one or more.

Aspect 9

The light-emitting module according to Aspect 8, wherein the first package and the second package have the same outer shape.

Aspect 10

The light-emitting module according to Aspect 8 or 9, wherein the first light-emitting device includes a plurality of first submounts including the submount, and the first semiconductor laser element is disposed on each of the plurality of first submounts, and the second light-emitting device includes one or a plurality of second submounts having a shape different from a shape of the submount, and the second semiconductor laser element is disposed on each of the one or the plurality of second submounts.

Aspect 11

The light-emitting module according to any one of Aspects 8 to 10, wherein the second light-emitting device includes a protective element mounted on the second package, and the protective element is not disposed on any of the one or the plurality of second submounts.

The light-emitting device or the light-emitting module according to the embodiments can be used for a projector, an on-vehicle headlight, a head-mounted display, lighting, a display, and the like.

What is claimed is:

1. A light-emitting device comprising:

a submount having a mounting surface, the submount including a wiring pattern arranged on the mounting surface, the wiring pattern being a single continuous pattern including a first region and a second region connected to the first region at a first position on the mounting surface;

a semiconductor laser element disposed on the first region of the wiring pattern; and a protective element disposed on the second region of the wiring pattern, wherein a width of the first region of the wiring pattern in a first direction is greater than a width of the semiconductor laser element in the first direction and equal to or less than a first distance, a length of the first region of the wiring pattern in a second direction between the first position and a distal end of the first region is a second distance, the second direction being perpendicular to the first direction, the second region is arranged on an opposite side of the first region with respect to the first position in a top view, a maximum width of the second region in the first direction is greater than the width of the first region in the first direction at the first position, and an interval in the second direction between the semiconductor laser element and the protective element is greater than 0 μm and less than 170 μm.

2. The light-emitting device according to claim 1, wherein the second distance is equal to or more than a value acquired by subtracting a length of a portion of the semiconductor laser element protruding from the mounting surface of the submount such that a light emission surface is spaced apart from the mounting surface in the top view from a length of the semiconductor laser element in the second direction.

3. The light-emitting device according to claim 1, wherein the protective element is disposed in a position not passed by an imaginary line that passes through a light-emitting point of the semiconductor laser element and that is parallel to the second direction in the top view.

4. The light-emitting device according to claim 1, wherein the protective element is disposed in a position passed by an imaginary line that passes through a first point and that is parallel to the second direction, the first point being an intersection point between an outer edge of the first region extending in the second direction and an outer edge of the second region extending in the first direction.

5. The light-emitting device according to claim 1, wherein the protective element has a width in the first direction greater than the width of the semiconductor laser element, and the protective element has a length in the second direction less than the width of the semiconductor laser element.

6. The light-emitting device according to claim 2, wherein an interval in the second direction between the semiconductor laser element and the protective element is in a range from 50 μm to 100 μm.

7. The light-emitting device according to claim 2, wherein an interval in the second direction between the semiconductor laser element and the protective element is greater than 0 μm and 80 μm or less.

8. The light-emitting device according to claim 1, further comprising:

a plurality of submounts including the submount, the plurality of the submounts are disposed side by side in the first direction;

a plurality of semiconductor laser elements including the semiconductor laser element, the plurality of semiconductor laser elements being respectively disposed on the plurality of submounts; and a plurality of protective elements including the protective element, the plurality of protective elements being respectively disposed on the plurality of submounts.

9. A light-emitting module comprising:

a first light-emitting device including a first package, the first light-emitting device being the light-emitting device according to claim 1, and including a plurality of first semiconductor laser elements including the semiconductor laser element;

a second light-emitting device including a second package, and including one or more second semiconductor laser elements; and a wiring substrate on which the first light-emitting device and the second light-emitting device are mounted, wherein a number of the second semiconductor laser elements in the second light-emitting device is less than a number of the first semiconductor laser elements in the first light-emitting device.

10. The light-emitting module according to claim 9, wherein the first package and the second package have a same outer shape.

11. The light-emitting module according to claim 9, wherein the first light-emitting device includes a plurality of first submounts including the submount, and the first semiconductor laser elements are respectively disposed on the plurality of first submounts, and the second light-emitting device includes one or more second submounts having a shape different from a shape of each of the first submounts, and the one or more second semiconductor laser elements are respectively disposed on the one or more second submounts.

12. The light-emitting module according to claim 9, wherein the second light-emitting device includes a protective element mounted on the second package, and the protective element is not disposed on any of the one or more second submounts.

* * * * *